(12) United States Patent
Shi et al.

(10) Patent No.: US 6,904,325 B2
(45) Date of Patent: Jun. 7, 2005

(54) METHOD FOR OPTIMIZING ECU PARALLEL FLASH PROGRAMMING ARRANGEMENT ON A CAN-BASED VEHICLE SERIAL BUS IN GENERAL ASSEMBLY

(75) Inventors: Jianying Shi, Rochester Hills, MI (US); Charles H. Rosa, Rochester Hills, MI (US)

(73) Assignee: General Motors Corporation, Detroit, MI (US)

(*) Notice: Subject to any disclaimer, the term of this patent is extended or adjusted under 35 U.S.C. 154(b) by 48 days.

(21) Appl. No.: 10/692,239

(22) Filed: Oct. 23, 2003

(65) Prior Publication Data

US 2005/0090906 A1 Apr. 28, 2005

(51) Int. Cl.$^7$ ............................................. G06F 13/00
(52) U.S. Cl. ............................ 700/2; 700/4; 700/86; 700/87; 717/149; 717/171; 710/100; 713/503; 711/100; 701/33
(58) Field of Search ........................... 700/86, 87, 2; 717/149, 171–178; 710/100; 713/400, 503; 711/100, 103; 701/33

(56) References Cited

U.S. PATENT DOCUMENTS

| | | | | | |
|---|---|---|---|---|---|
| 5,870,520 A | * | 2/1999 | Lee et al. | ...................... | 714/6 |
| 6,505,105 B2 | * | 1/2003 | Allen et al. | ................... | 701/33 |
| 6,546,455 B1 | * | 4/2003 | Hurich et al. | ............... | 711/103 |
| 2004/0153590 A1 | * | 8/2004 | Roger et al. | ................ | 710/100 |

OTHER PUBLICATIONS

"Electronics Testing—Communication Adapter X–tronic Icom"–http://www.durr.com/e/auto/catalog/14_EM_Electronics_Test.pdf.*

* cited by examiner

Primary Examiner—Leo Picard
Assistant Examiner—Michael D. Masinick
(74) Attorney, Agent, or Firm—Kathryan A. Marra

(57) ABSTRACT

A parallel flash programming system for use in motor vehicle assembly includes an input receptive of information relating to a predetermined number of processors connected to a system bus, processor flash programming attributes, and system bus attributes. An incremental flash programming times determination module is adapted, based on the information, to determine incremental flash programming times of a processor in relation to multiple interframe wait times respective of multiple parallel flash programming schema in accordance with the predetermined number of processors. A global flash programming time resolution module is adapted to determine, based on incremental flash programming times respective of multiple processors of the predetermined number, an assignment of the multiple processors to a number of parallel programming tracks yielding a global flash programming time in accordance with predetermined criteria.

20 Claims, 8 Drawing Sheets

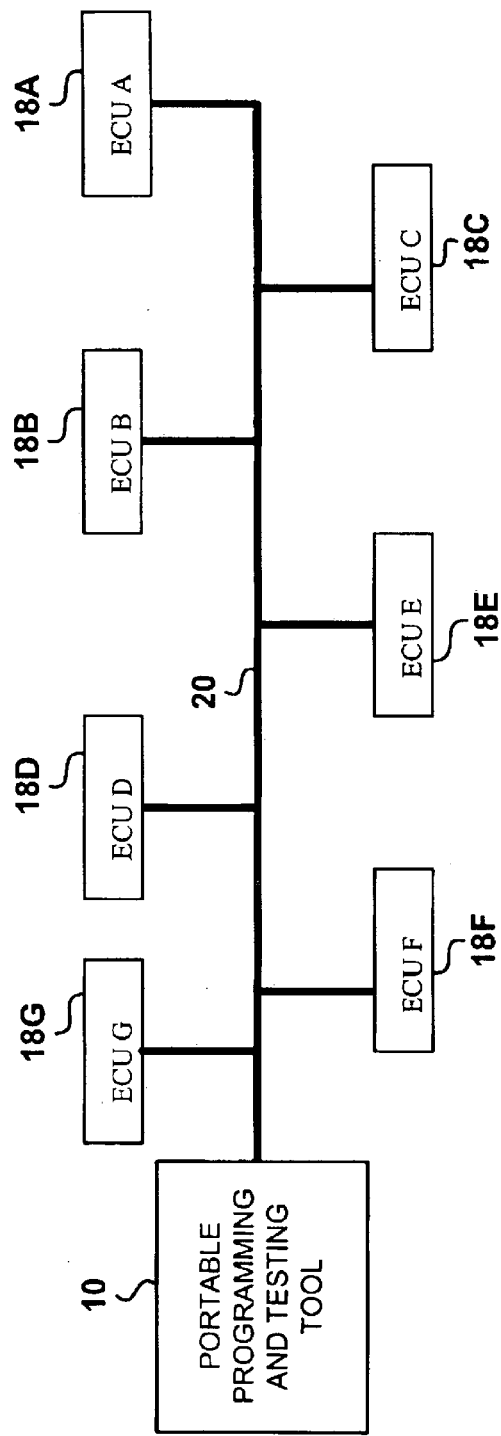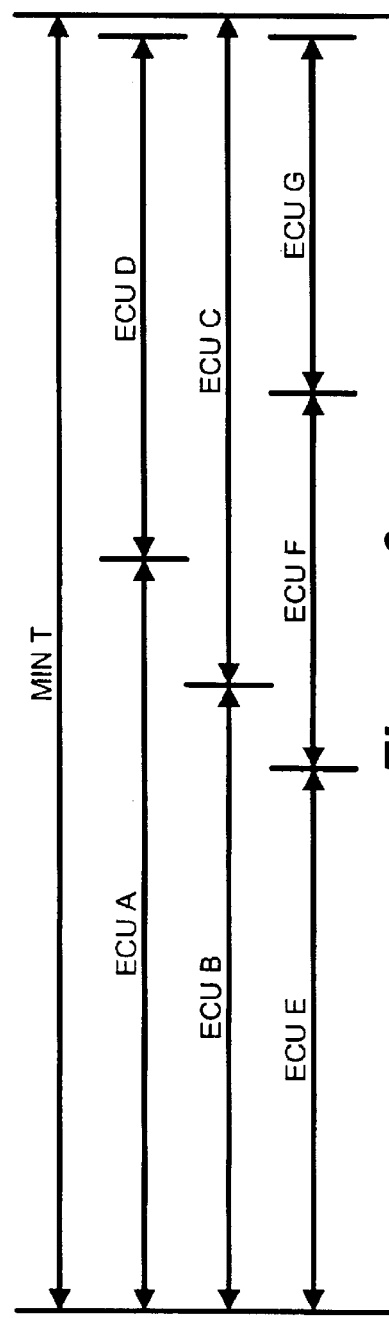
Figure - 3
PRIOR ART
Figure - 9

METHOD FOR OPTIMIZING ECU PARALLEL FLASH PROGRAMMING ARRANGEMENT ON A CAN-BASED VEHICLE SERIAL BUS IN GENERAL ASSEMBLY

FIELD OF THE INVENTION

The present invention generally relates to vehicle assembly systems and methods, and particularly to parallel flash programming of multiple ECUs on a CAN-based vehicle serial bus for use during a vehicle assembly process.

BACKGROUND OF THE INVENTION

Today's vehicle final assembly process' uses, for example, a portable programming and testing tool 10 mounted on the vehicle steering wheel 12 as shown in FIG. 1 to flash program vehicle calibration tables for vehicle electrical control units (ECUs). For example, the power train control module (PCM) is one of the ECU's flash-programmed at the assembly plant. Flash programming at assembly plants provides a flexible mechanism for incorporating changes in calibration tables. However, this programming process consumes limited and valuable production job space on the final assembly line. In the past few years, the software content of vehicle ECUs has increased, requiring more time (thus more workstation space on the assembly line) for flash programming.

An improved controller area network (CAN) bus is being introduced in various vehicle platforms. As a CAN-based (ISO 11898 and ISO 15765) serial protocol, the improved CAN bus divides one message into 8 byte frames and transmits one 8-byte frame at a time. Between subsequent frames designated to the same ECU, there has to be a wait time (called the inter-frame wait time). The inter-frame wait time is wasted time on the CAN bus. Parallel flash programming is a technique to utilize the inter-frame wait time on the CAN bus for flashing another ECU at the same time to achieve near 100% CAN bus utilization. Parallel flash programming is also termed the frame interleaving technique. Accordingly, given N ECUs, if the inter-frame wait time 16 is set to a multiple M (<N) of the single frame transfer time, a total of M+1 ECUs can theoretically be parallel flash programmed. As shown in FIG. 2, when the inter-frame wait time 16 is set to twice the single frame transfer time 14, the interleaving of three frames are achieved, thus three ECUs (A, B, and C) may be parallel flash programmed at the same time.

As a vehicle manufacturer moves to a common electrical architecture for vehicle control systems, more and more ECUs are shared across vehicle platforms and more and more software-enabled features are delivered via the assembly plant process. Thus, when multiple ECUs are connected to the same CAN bus, each ECU has different sets of calibration tables to be flash programmed at the assembly plant. As a result, many strategies exist to flash program multiple ECUs, and the number of possible strategies rises with the number of ECUs connected to the bus. As an example shown in FIG. 3, seven ECUs 18A–18G are connected to the same CAN bus 20 in a vehicle. Thus, one strategy is, for example, to parallel flash program all seven ECUs at the same time. In contrast, another strategy is to parallel flash program three ECUs and then four ECUs. Many more strategies also exist. However, selecting the right strategy to reduce programming time and increase use of the bus 20 is a difficult problem. The present invention provides a solution to this problem.

SUMMARY OF THE INVENTION

In accordance with the present invention, a parallel flash programming system for use in motor vehicle assembly includes an input receptive of information relating to a predetermined number of processors connected to a system bus, processor flash programming attributes, and system bus attributes. An incremental flash programming times determination module is adapted, based on the information, to determine incremental flash programming times of a processor in relation to multiple interframe wait times respective of multiple parallel flash programming schema in accordance with the predetermined number of processors. A global flash programming time resolution module is adapted to determine, based on incremental flash programming times respective of multiple processors of the predetermined number, an assignment of the multiple processors to a number of parallel programming tracks yielding a global flash programming time in accordance with predetermined criteria.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3 is an entity relationship diagram illustrating simultaneous connection of multiple ECUs to a CAN serial bus in a motor vehicle in accordance with the present invention;

FIG. 9 is a temporal graph illustrating minimized total flash programming time for three parallel tracks.

DETAILED DESCRIPTION OF THE PREFERRED EMBODIMENTS

The following description of the preferred embodiment(s) is merely exemplary in nature and is in no way intended to limit the invention, its application, or uses.

Figure 2:
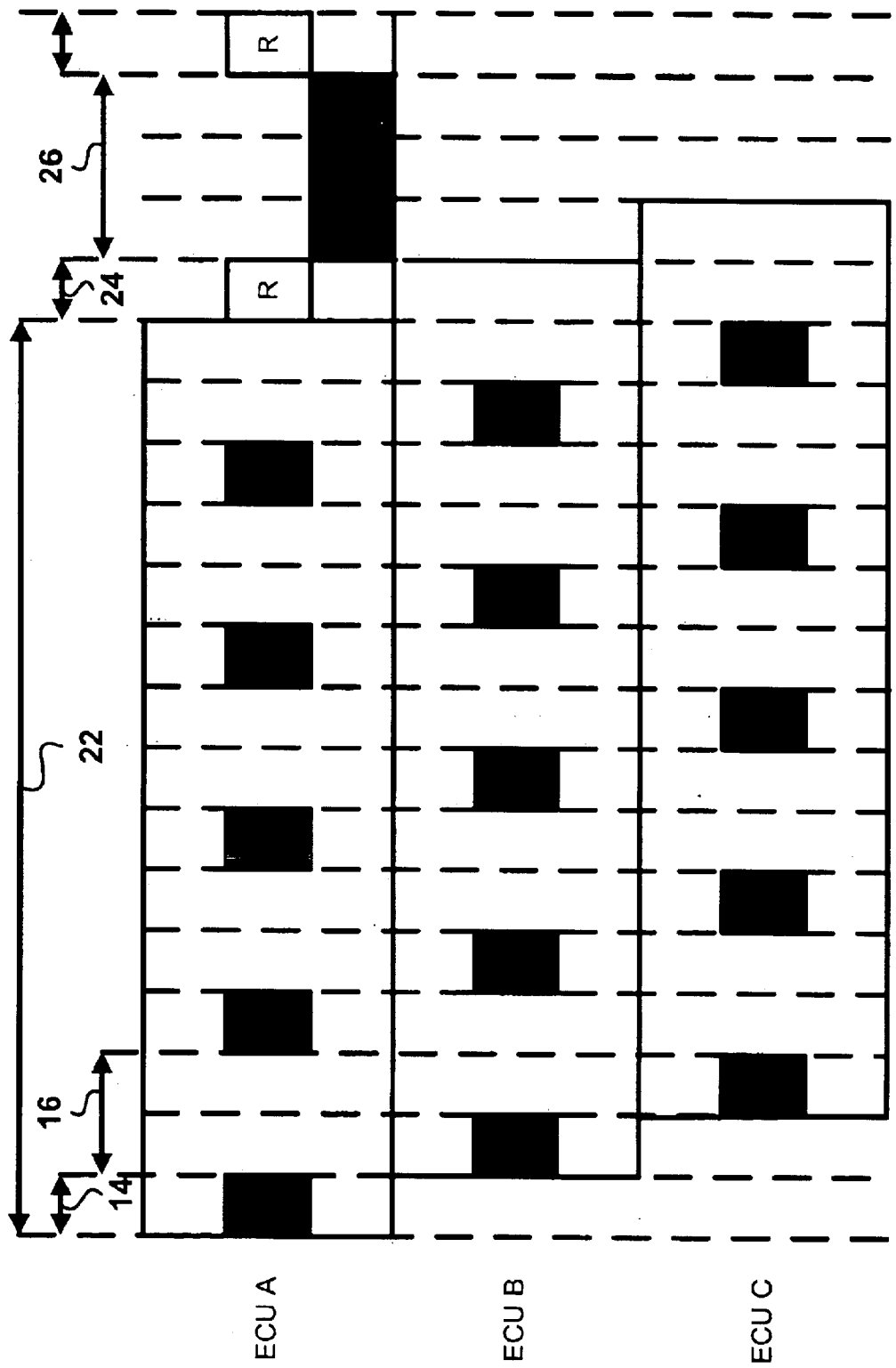
FIG. 2 is a temporal graph illustrating simultaneous, parallel flash programming of multiple ECUs utilizing interframe wait time on a CAN bus in accordance with the present invention.
Figure 4:
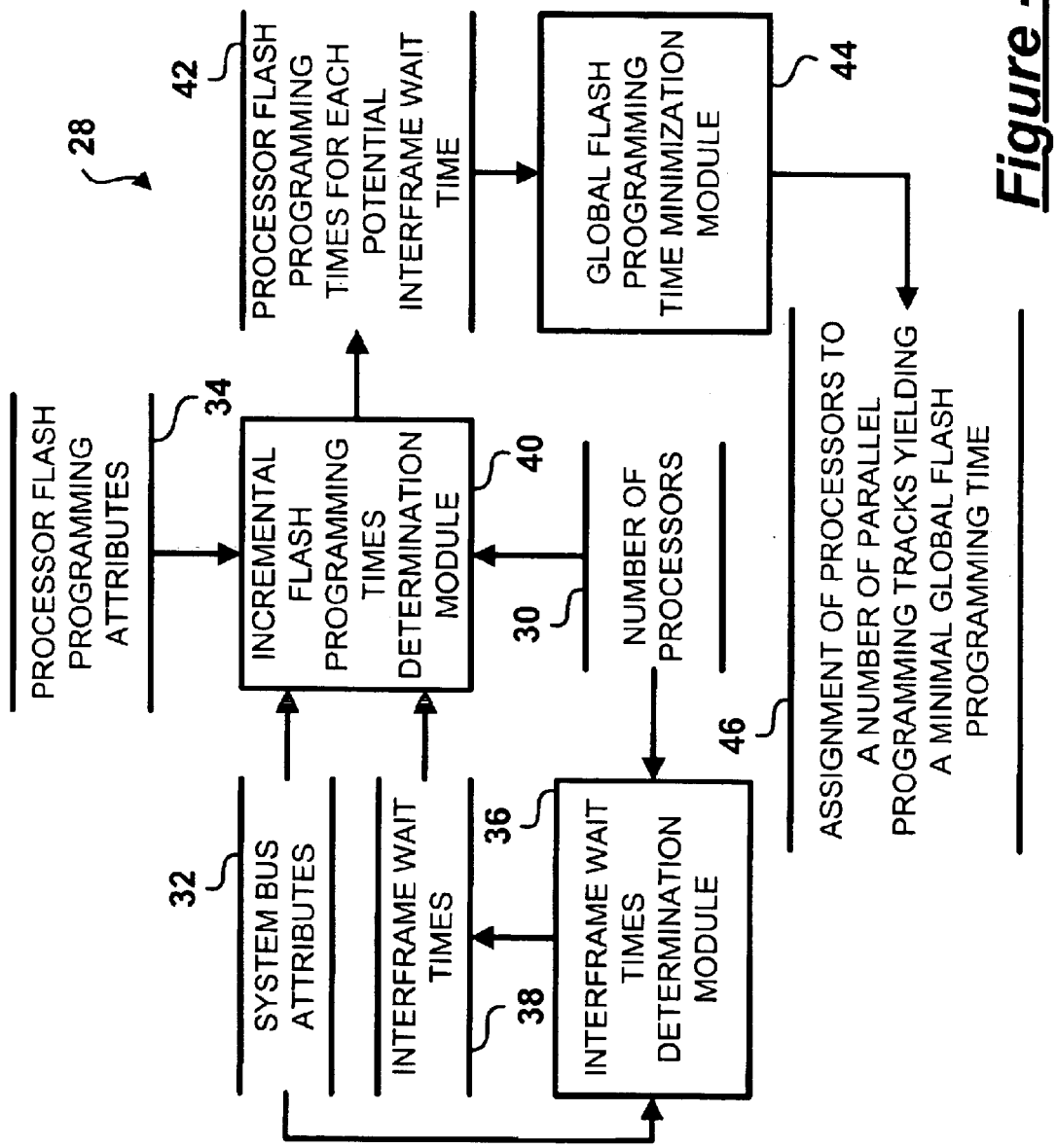
FIG. 4 is a functional block diagram depicting a parallel flash programming system in accordance with the present invention.

Referring to FIG. 2, the frame interleaving technique is a known process. However, the present invention incorporates a novel identification and analysis of the variables affecting performance of this process. Accordingly, the time to parallel flash program an ECU is dependent upon the message transfer time 22, which is a function of ECU buffer size, single frame transfer time 14, and interframe wait time 16. It is also dependent on response time 24 and flash write time 26. Further, the ECU flash programming time is dependent on the total number of messages 22, which is a function of the number and sizes of calibration tables and/or vehicle software files to be programmed on the ECU. In turn, single frame transfer time is dependent on system bus attributes, and interframe wait time 14 is dependent on the number of ECUs being parallel flash programmed. Thus, parallel flash programming system 28 of FIG. 4 in accordance with the present invention employs information relating to a total number of processors 30 connected to the system bus, system bus attributes 32, and processor flash programming attributes 34.

In a first embodiment, system 28 includes an interframe wait times determination module 36 adapted to determine maximum and minimum interframe wait times 38 based on the number of processors 30 and system bus attributes. Accordingly, incremental flash programming times determination module 40 receives the wait times 38 and processor flash programming attributes 34 corresponding to experimentally determined maximum and minimum flash programming times for each processor. Module 40 accordingly calculates multiple, incremental flash programming times 42 for each processor with reference to each potential interframe wait time as further explained below with reference to FIG. 5.

In a second embodiment, module 40 (FIG. 4) of system 28 receives information relating to number of processors 30, system bus attributes 32, and processor flash programming attributes 34. The system bus attributes 32 include bus baudrate, bits per frame, and time to the start of flow control frame transmission. The processor flash programming attributes 34 include processor buffer size, number and size of tables, response time 24, and flash write time 26. Module 40 determines all of the potential interframe wait times based on the number of processors 30 and the system bus attributes 32. Module 40 also determines multiple, incremental flash programming times 42 for each potential interframe wait time based on the processor flash programming attributes 34. These processes are further explained below with reference to FIG. 5.

In accordance with either the first embodiment or the second embodiment, global flash programming time minimization module 44 (FIG. 4) receives processor flash programming times 42. This information is preferably received in the form of an N×N matrix having processor rows, potential interframe wait time columns, and processor flash programming time cells. Module 44 also generates an assignment of processors 46 to a number of parallel flash programming tracks that yields a minimal global flash programming time; herein, tracks are considered equivalent to sessions or channels. Module 44 may operate in various ways according to two sub-embodiments.

According to the first sub-embodiment, module 44 operates by employing a sophisticated mixed integer program (MIP) solver such as XPRESS-MP or CPLEX to formulate an optimization of the global flash programming time in the presence of constraints. Thus, module 44 performs multiple combinatorial assignments of processors to various numbers of tracks utilizing constraints specifying at least one processor per track, and specifying no more tracks than the total number of processors 30, which may be determined from the number of columns of the received matrix. Also, module 44 determines multiple global programming times based on the multiple combinatorial assignments and the incremental flash programming times. Further, module 44 selects an assignment of processors to a number of tracks that minimizes the global flash programming time. These procedures are further explained below with reference to FIG. 5.

According to the second sub-embodiment, module 44 (FIG. 4) operates by utilizing a heuristic technique. The heuristic technique includes determining multiple, average flash programming times of multiple interframe wait times based on the incremental flash programming times. It also includes recursively comparing average flash programming times of each interframe wait time to a flash programming time of greatest magnitude for the interframe wait time and recording the difference. It further includes selecting an interframe wait time at which the difference is minimized, and selecting a number of parallel programming tracks corresponding to the interframe wait time. The heuristic technique also includes assigning processors to tracks as further explained below with reference to FIG. 6.

Figure 5:
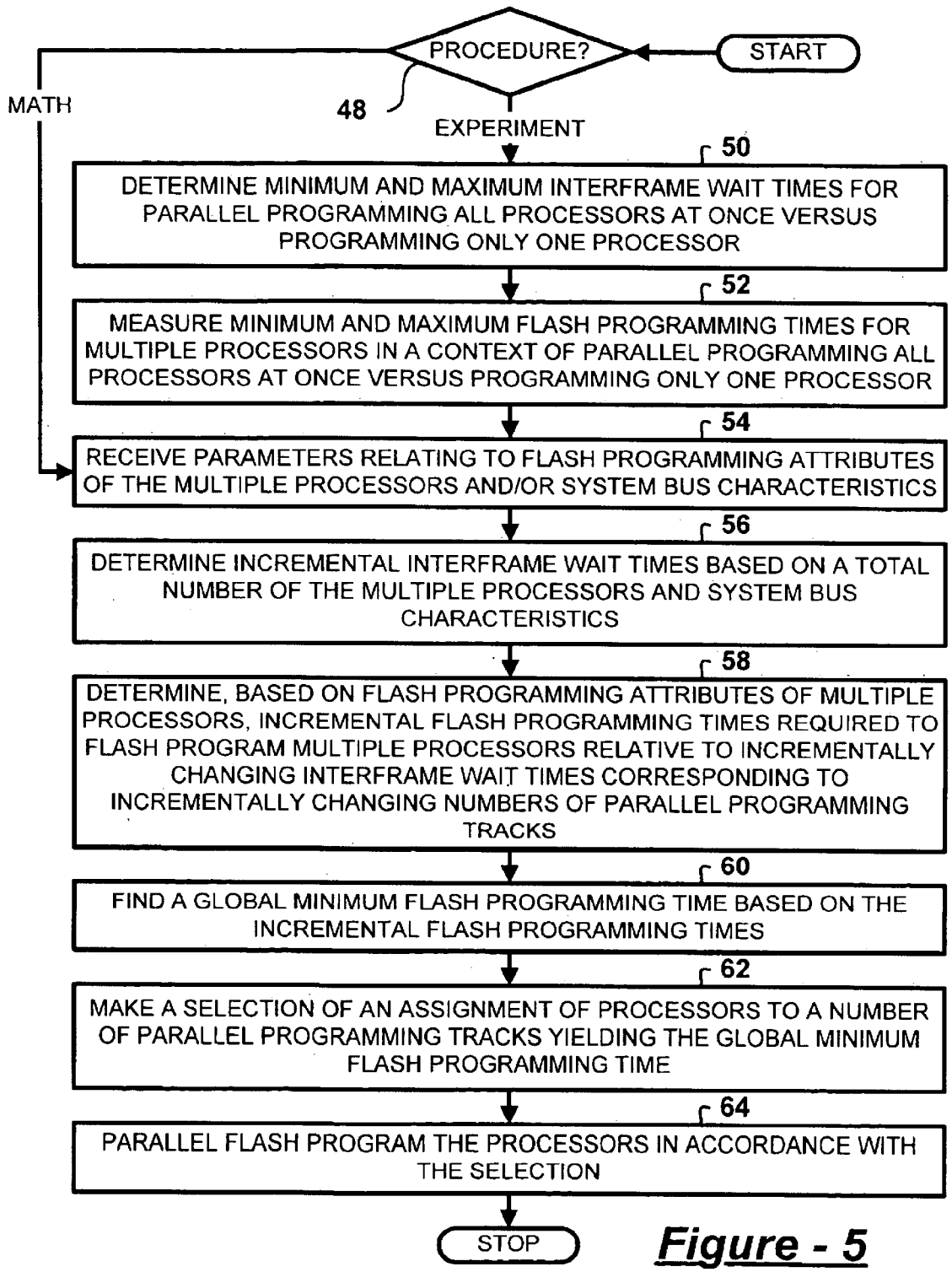
FIG. 5 is a flow diagram depicting a parallel flash programming method in accordance with the present invention.

Turning now to FIG. 5, the present invention provides a method to determine the best strategy for parallel flash programming multiple ECUs on the same CAN bus so that the total flash programming time is minimized. Two embodiments provide the option of proceding experimentally or mathematically as at 48. If proceeding experimentally, the invention includes determining maximum and minimum interframe wait times at step 50 for parallel programming all processors at once versus programming only one processor at a time. For example, given a total of N ECUs on the CAN bus to be flash programmed at the assembly plant, the invention includes determining minimum and maximum inter-frame wait times $T_{IFW}(0)$ and $T_{IFW}(1)$ according to:

$$T_{IFW}(0) = \min T_{IFW} \text{ and} \qquad (1.1)$$

$$T_{IFW}(1) = (N-1) * \frac{Bits_{frame}}{P_{bus}} \qquad (1.2)$$

$\text{Min}T_{IFW}$ refers to the minimum inter-frame wait time. $P_{bus}$ refers to the CAN bus baudrate. $Bits_{frame}$ refers to the number of bits per frame transmitted over the CAN bus.

$$\frac{Bits_{frame}}{P_{bus}}$$

refers to the single frame transfer time. For $i_{th}$ ECU (i=1, . . . , N), the inter-frame wait time for each ECU is set to be (1.1) and (1.2).

The invention also includes determining the flash programming time for each ECU either mathematically or by experiment. For example, determining the flash programming time by experiment at step 52 includes programming the $i_{th}$ ECU to determine the minimum and maximum flash programming time T(i,0) and T(i,N−1). These parameters, minimum and maximum interframe wait times and minimum and maximum flash programming times are then received at step 54. as flash programming attributes and system bus characteristics. However, if the method is proceeding mathematically, then the parameters received at step 54 are more detailed as described above with reference to FIG. 4. Accordingly, the flash programming time T(i,0) and T(i,N−1) may be calculated mathematically for each ECU at each potential interframe wait time in steps 56 and 58 according to:

$$T(i, j) = \sum_{x=1}^{m} \frac{S_{calset(x)}}{S_{Buffer}} * \left(\left(1 + \text{Roundup}\left(\frac{S_{Buffer} - 6}{7}\right)\right) * \left(\frac{Bits_{frame}}{P_{Bus}} + T_{IFWt}\right) + T_{FW} + 2 * T_{resp} + T_{FR}\right) \quad (1.3)$$

$S_{Buffer}$ refers to buffer size in bytes. $S_{calset(x)}$ refers to size of each calibration table in bytes. m refers to the total number of calibration tables to be flash programmed for the ECU. $P_{Bus}$ refers to CAN bus baudrate. $Bits_{frame}$ refers to number of bits per frame. $T_{IFWt}$ refers to inter-frame wait time. $T_{FW}$ refers to time to write calibration data in RAM buffer to the flash memory device. $T_{resp}$ refers to time to transfer the response frame. $T_{FR}$ refers to time to the start of flow control frame transmission. Alternatively, the incremental flash programming times may be determined based on the experimental data by generating an N×N matrix:

$$\begin{bmatrix} T(1, 0) & T(1, 1) & \ldots & T(1, N-1) \\ T(2, 0) & T(2, 1) & \ldots & T(2, N-1) \\ \ldots & \ldots & \ldots & \ldots \\ T(N, 0) & T(N, 1) & \ldots & T(N, N-1) \end{bmatrix} \quad (1.4)$$

according to:

$$T(i, j) = \quad (1.5)$$
$$T(i, N-1) - \left(\frac{T(i, N-1) - T(i, 0)}{T_{IFW}(1) - T_{IFW}(0)}\right) * [(N-1) - j] * \frac{Bits_{frame}}{P_{bus}}$$

The same matrix may be generated mathematically by equation (1.3), with the potential interframe wait times being determined according to:

$$T_{IFW}(j) = j * \frac{Bits_{frame}}{P_{bus}} \quad j = 1, 2, \ldots, N-1 \quad (1.6)$$

The row of matrix (1.4) is for $i_{th}$ ECU with incremental inter-frame wait time set to be min, 1, 2, . . . , (N−1) frame transfer time. The column of matrix (1.4) is for all N ECUs with an identical inter-frame wait time. It should be readily understood that matrix (1.4) is a preferred data structure. It is envisioned that other data structures may be employed with the present invention to record incremental flash programming times for processors in association with potential interframe wait times.

The method includes finding a global minimum flash programming time based on the incremental flash programming times at step 60. Also, the method includes making a selection of an assignment of processors to a number of parallel programming tracks yielding the global minimum flash programming time at step 62. Finally, the method may include parallel flash programming the processors in accordance with the selection at step 64.

A first sub-embodiment accomplishes steps 60 and 62 by solving the following math programming problem to find the global minimum total flash programming time under the presence of constraints on the maximum and minimum number of parallel tracks to exploit.

Parameters:
N>=0—Number of ECUs
Matrix T as found in (1.4)
MaxNumberOfParallelTracks>=1—Maximum number of permissible parallel tracks to use
MinNumberOfParallelTracks>=1—Minimum number of permissible parallel tracks to use Variables:
TotalProgrammingTime[i] for all i in 1 . . . N>=0, <=(max$_{\{j\ in\ 0\ \ldots\ N-1\}}$ T[i,j])–Total Flash Programming Time associated with ECU i
X[i,j] for all i,j in 1 . . . N>=0, <=(max$_{\{k\ in\ 0\ \ldots\ N-1\}}$ T[i,k])—The amount of time required to flash $i^{th}$ ECU (function of w)
Y[i,j] for all i,j in 1 . . . N, binary—A variable that equals 1 if the $i^{th}$ ECU assigned to $j^{th}$ track. 0 otherwise.
W[i] for all i in 0 . . . N-1, binary—A variable that equals 1 if inter-frame spacing is equal to i frame-units. 0 otherwise.
lastTime>=0, <=(sum{i in 1 . . . N} (max$_{\{j\ in\ 0\ \ldots\ N-1\}}$ T[i,j]))—Total flash programming time
V[j] for all j in 1 . . . N; binary—0-1 variable that indicates that parallel track j must have an ECU assigned to it Mixed Integer Program (MIP) Combinatorial Optimization Formulation:
Minimize lastTime (1.7)
Subject to:
W[j]=0 for all j in MaxNumberOfParallelTracks . . . N−1 (1.7.1)
W[j]=0 for all j in 0 . . . MinNumberOfParallelTracks—2 such that minNumberOfParallelTracks>1 (1.7.2)
sum{j in 1 . . . number_OF_ECU} Y[i,j]=1 for all i in 1 . . . N (1.7.3)
X[i,j]<=(max$_{\{k\ in\ 0\ \ldots\ N-1\}}$ programmingTime[i,k])*Y[i,j] for all i,j in 1 . . . N (1.7.4)
X[i,j]>=T[i,j−1]*Y[i,j] for all i in 1 . . . N, j in 1 . . . N (1.7.5)
sum{i in 1 . . . N}x [i,j]<=lastTime for all j in 1 . . . N (1.7.6)
TotalProgrammingTime [i]<=lastTime for all i in 1 . . . N (1.7.7)
sum{i in 0 . . . N−1} w[i]=1; (1.7.8)
sum{j in 1 . . . N} X[i,j]=TotalProgrammingTime[i] for all i in 1 . . . N (1.7.9)
TotalProgrammingTime[i]=sum{j in 0 . . . N−1} T[i,j]*W[j] for all i in 1 . . . N (1.7.10)
Y[i,j]<=1−W[k] for all i in 1 . . . N, j in 1 . . . N, k in 0 . . . N−1 such that j>k+1 (1.7.11)
X[i,j]<=(max$_{\{i\ in\ 0\ \ldots\ N-1\}}$ T[i,l])*(1−W[k]) for all i in 1 . . . N, j in 1 . . . N, k in 0 . . . N−1 such that j>k+1 (1.7.12)
sum{j in 1 . . . N: j<=k+1} Y[i,j]>=W[k] for all i in 1 . . . N, k in 0 . . . N−1 (1.7.13)
W[numSlot]<=V[j] for all numSlot in 0 . . . N−1, j in 1 . . . N: j<=numSlot+1 (1.7.14)
1−W[numSlot]>=[j] for all numSlot in 0 . . . N−1, j in 1 . . . N: j>numSlot+1 (1.7.15)
V[j]<=sum{i in 1 . . . N} y[i,j] for all j in 1 . . . N (1.7.16)
V[j]>=Y[i,j] for all j in 1 . . . N, i in 1 . . . N (1.7.17)

This problem is an example of a potentially difficult combinatorial optimization problem. The above formulation requires a sophisticated MIP solver like XPRESS-MP or CPLEX. However, when a solver such as these is not available, it remains possible to accomplish steps 60 and 62 using heuristic techniques to find the interframe wait time yielding the minimum global flash programming time, and to assign the corresponding processor flash programming times to an appropriate number of parallel flash programming tracks. These heuristic techniques are explored with reference to FIGS. 6–9.

Figure 6:
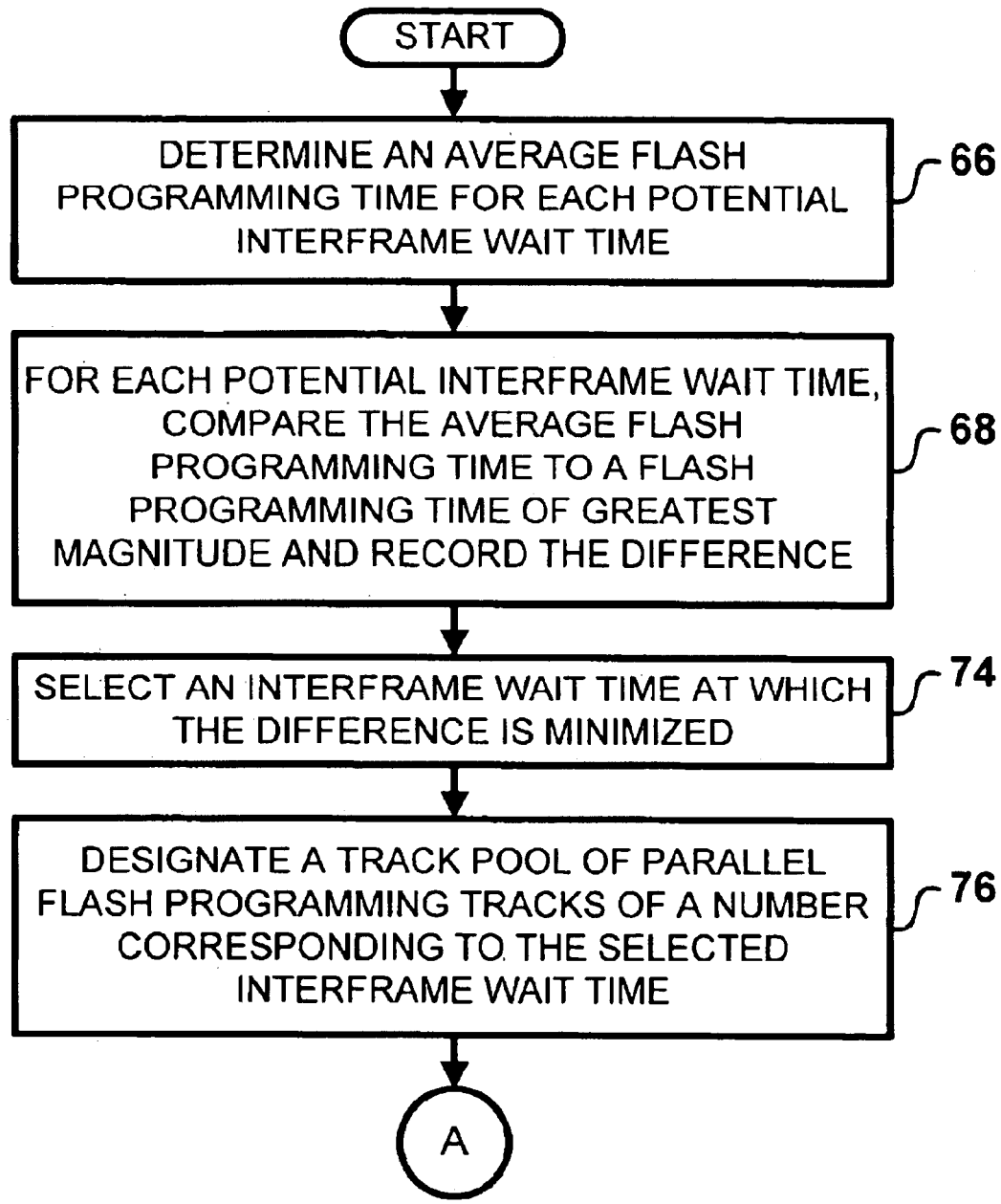
FIG. 6 is a flow diagram depicting a heuristic method of selecting a number of parallel programming tracks that yields a minimum global flash programming time in accordance with the present invention.

FIG. 6 illustrates a heuristic procedure that quickly identifies a viable optimal number of parallel flash programming tracks to use. It also helps a user to choose another parallel track number and find the lower bound for the choice. Accordingly, the method includes determining an average flash programming time for each potential interframe wait time at step 66. In a preferred embodiment, step 66 includes calculating the average value of the $j_{th}$ column of matrix (1.4) according to:

$$T_{ave}(j) = \frac{1}{j+1} \sum_{i=1}^{N} T(i, j) \quad j = 0, 1, 2, \ldots, N-1 \quad (1.8)$$

The method also includes comparing the average flash programming time to the maximum flash programming time for each potential interframe wait time and recording the difference at step 70. In a preferred embodiment, step 72 includes calculating a maximum value of the $j_{th}$ column as $$T_{max}(j) = \max_{i=1 \ldots N} (T(i, j), T_{ave}(j)) \quad j = 0, 1, 2, \ldots, N-1 \quad (1.9)$$

and plotting the N by N matrix (1.4) and (1.9) with respect to its inter-frame wait time. The space above the upper curve (1.9) is the actual feasible region for an optimal solution.

Figure 7:
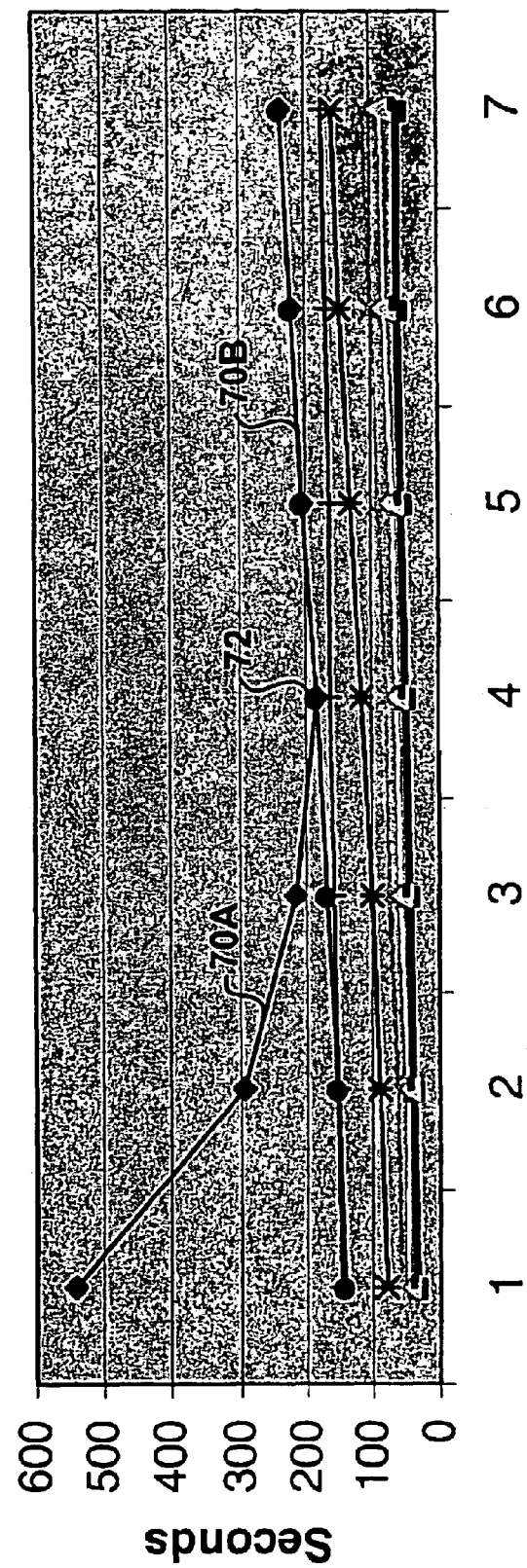
FIG. 7 is a graph illustrating use of a Tmax(j) curve to find the optimal number of parallel tracks in accordance with the present invention.

FIG. 7 illustrates the resulting plot of matrix (1.4) and (1.9) in an example for seven processors. The leftmost portion 70A of the upper curve illustrates that the average value decreases as the interframe wait time increases. The rightmost portion 70B of the upper curve illustrates that the maximum value increases as the interframe wait time increases. A global minimum value is identified at 72 such that the optimal parallel track number is four; the total flash programming time for all seven ECUs arranged on four parallel tracks is minimized compared to other parallel track numbers. Selecting this track number in steps 74 (FIG. 6) and 76 is equivalent to selecting an interframe wait time at which the difference between the average and maximum values is minimized in step 74, and designating a track pool of a number corresponding to the selected interframe wait time at step 76. In a preferred embodiment, steps 74 and 76 include finding the minimum value of Tmax set min($T_{max}(j)$) at $j_{min}$, where $j_{min}$ is the number of parallel tracks which yield minimum total flash programming time for the given N ECUs. However, if the user prefers another parallel track number, the user can quickly find the lower bound for the total flash programming time at that number of tracks, because the total flash programming time cannot be smaller than $T_{max}(j)$.

Figure 8:
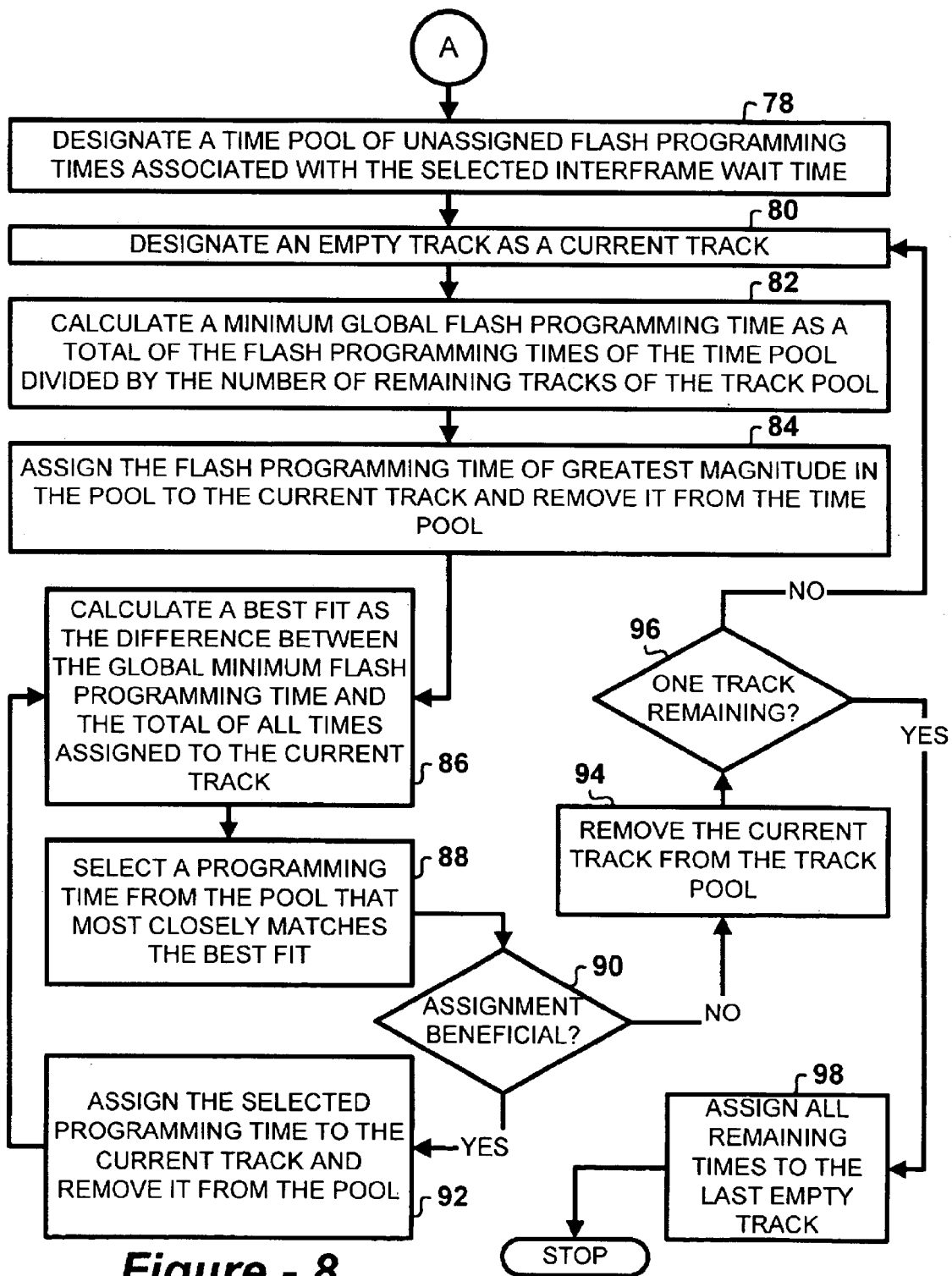
FIG. 8 is a flow diagram depicting a heuristic method of assigning processors to the selected number of parallel programming tracks to achieve a reduced global flash programming time in accordance with the present invention.

FIG. 8 illustrates an iterative process for effectively finding an effective processor assignment on the chosen track without using a powerful optimization solver. This heuristic technique finds, the grouping of ECUs to achieve the minimized total flash programming time for the desired number of tracks. The heuristic method eliminates the-explicit consideration of single ECU assignment to all possible tracks, and, thus, removes a huge number of solutions from the consideration set that normally must be searched by traditional MIP techniques. It is a recursive procedure that proceeds through each of the tracks and determines the ECU assignment that achieves the minimum total flash programming time. It utilizes a very simple and effective rule to pick the candidate ECUs for the current candidate track if multiple choices are available.

This heuristic technique uses the total number of tracks j identified as detailed above. The best potential flash programming time will be $T_{max}(j)$ based on equation (1.9). However, the discrete nature of flash programming time for each ECU ensures that the final minimized flash programming time will be longer than that lower bound. Achieving a best fit of processor flash programming times to tracks minimizes this time as effectively as possible. Accordingly, the method includes designating a time pool of unassigned flash programming times associated with the selected interframe wait time at step 78. In a preferred embodiment, step 78 includes selecting the $j_{th}$ column of matrix (1.4), $\vec{V}=T(i,j)$, where i=1 ,2, . . . , N. This vector is for all N ECUs with (j−1) times single frame transfer time to accommodate the total of j parallel tracks. Step 78 further preferably includes sorting the vector in an ascending order from minimum value to maximum value $\vec{V}_{sorted}$. The method also includes designating an empty track of the track pool as the current track at step 80. Step 80 preferably includes starting at the first track as the current candidate track L. In FIG. 9, for example, L=1 is selected as a starting track number. The method further includes calculating a minimum global flash programming time for a current recursion at step 82 as a total of the flash programming times of the time pool divided by the number of remaining tracks of the track pool.

The flash programming time of greatest magnitude in the time pool is assigned to the current track at step 84, which removes it from the pool. In a preferred embodiment, step 84 includes picking the maximum value of the sorted vector, Vmax =max($\vec{V}_{sorted}$) and placing this ECU on the current candidate track L. In FIG. 9, for example, ECU A is the first Vmax picked for the current track L=1 during a first recursion. Then a best fit is found at step 86 (FIG. 8) as the difference between the total time assigned to the current track and the minimum global flash programming time for the current recursion. In a preferred embodiment, step 86 includes calculating $\delta=T_{ave}-V_{max}$ where $$T_{ave} = \frac{\sum V_{sorted}}{j-L-1}. \quad (1.10)$$

Then, a flash programming time that most closely matches the best fit is selected at step 88, and an evaluation is made as at 90 to determine if assignment of the selected time to the current track would be beneficial. In a preferred embodiment, steps 88 and 90 include picking a closest v(I) value to δ from the rest of the $\vec{V}_{sorted}$ set and calculating:

$$T_{ave}(0) = \frac{\sum V_{sorted}}{(j+1)-(L+1)} \text{ and} \quad (1.11)$$

$$T_{ave}(1) = \frac{\sum V_{sorted} - V(l)}{(j+1)-(L+1)} \quad (1.12)$$

Equation (1.1 1) yields the average total flash programming time for the remaining tracks excluding the current-track if the current pick v(I) is not chosen. Similarly, equation (1.12) is the average total flash programming time for the remaining tracks if the current pick v(I) is chosen. Since (1.12) will always be smaller than the (1.11) value, any ECU assignment to the current track reduces future track total flash programming time. However, it is possible that the selected v(I) will be significantly larger than the best fit, and that an assignment of the selected v(I) to the current track will not be beneficial. Therefore, the preferred embodiment includes evaluating the benefit of assigning v(I) to the current track according to:

$$|T_{ave} - T_{ave}(0)| > |T_{ave} - T_{ave}(1)| \quad (1.13)$$

$T_{ave}$ yields the minimum global flash programming time for the current recursion. Similarly, $T_{ave}(0)$ and $T_{ave}(1)$ thus yield the potential minimum global flash programming times for the next recursion, depending on whether v(I) is assigned to the current track. Thus, if (1.13) is true, then it is appropriate to assign v(I) to the current track. The rule enforced by (1.13) is an effective and efficient way to minimize the difference of flash programming time among subsequent tracks. As the example shown in FIG. 9 demonstrates, this rule forces the difference between the total flash programming time of all three tracks to be minimized.

If it proves beneficial to assign v(I) to the current track, then the selected flash programming time is assigned to current track at step 92, which removes it from the time pool. Then, the method returns to step 86 and continues to assign best fitting times to the current track as long as it proves beneficial to do so. However, once it proves not beneficial to assign the selected time to the current track, then the current track is removed from the track pool at step 94. If more than one track remains in the track pool as at 96, then processing returns to step 80 and each empty track is assigned processor programming times in the same fashion as discussed above. However, it is only necessary to assign all remaining times in the time pool to the last remaining track at step 98. Thus, in keeping with the preferred embodiment, steps 80–98 include recursively working with the remaining set of $\vec{V}_{sorted}$ and incrementing L to the next track number until the track number-L reaches the total number of tracks j.

Figure 1:
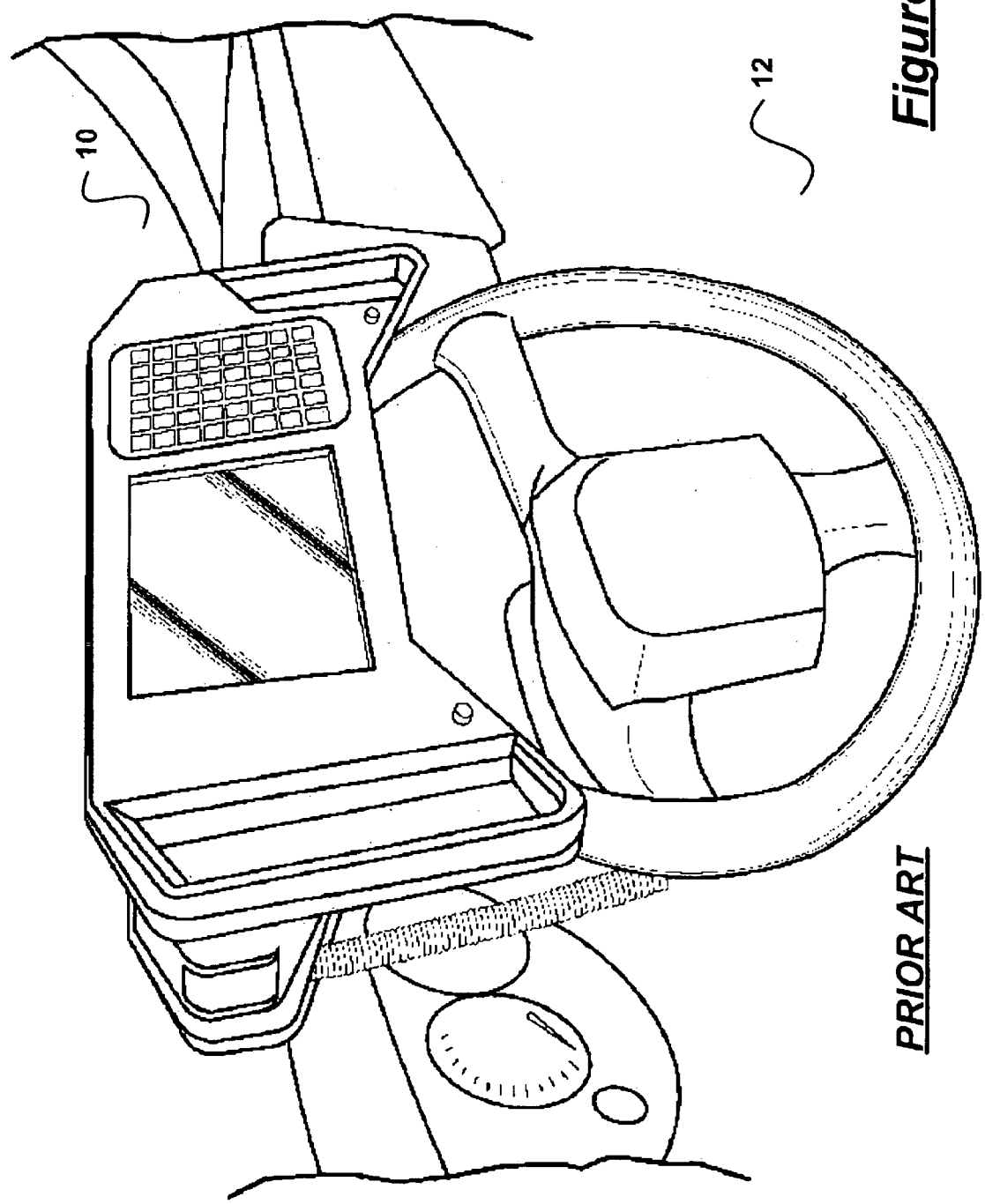
FIG. 1 is a perspective view of a portable programming and testing tool used for flash programming ECUs at a final assembly line in a motor vehicle assembly plant in accordance with the present invention.

The description of the invention is merely exemplary in nature and, thus, variations that do not depart from the gist of the invention are intended to be within the scope of the invention. For example, the present invention may be employed lo optimize parallel flash programming in numerous contexts including but not limited to downloading calibration tables and downloading different types of vehicle software, such as software operable to adapt vehicle processors for operation of respective component systems. Also, the present invention is not limited to use during vehicle assembly. For example, the present invention may be employed to optimize parallel flash programming in numerous contexts including but not limited to vehicle pre-assembly, sub-assembly, vehicle upgrade, and vehicle repair procedures. Further, the invention may be used in wireless media for parallel flash programming multiple vehicle processors during operation as with vehicle navigation, operator assistance, and real-time entertainment systems. Moreover, the present invention is not limited to use with the portable programming and testing tool of FIG. 1, but can be implemented with any processor capable of parallel flash programming the vehicle, whether internal or external. Such variations are not to be regarded as a departure from the spirit and scope of the invention.

What is claimed is:

1. A parallel flash programming system for use in motor vehicle assembly, comprising:
   an input receptive of information relating to a predetermined number of processors connected to a system bus, processor flash programming attributes, and system bus attributes;
   an incremental flash programming times determination module adapted, based on the information, to determine incremental flash programming times of a processor in relation to multiple interframe wait times respective of multiple parallel flash programming schema in accordance with the predetermined number of processors; and
   a global flash programming time resolution module adapted to determine, based on incremental flash programming times respective of multiple processors of the predetermined number, an assignment of the multiple processors to a number of parallel programming tracks yielding a global flash programming time in accordance with predetermined criteria.

2. The system of claim 1, wherein said incremental flash programming times determination module is adapted to mathematically determine incremental flash programming times T(i,j) of the processor according to:

$$T(i, j) = \sum_{x=1}^{m} \frac{S_{calset(x)}}{S_{Buffer}} * \left(\left(1 + \text{Roundup}\left(\frac{S_{Buffer} - 6}{7}\right)\right)\right) * \left(\frac{Bits_{frame}}{P_{Bus}} + T_{IFWt}\right) + T_{FW} + 2 * T_{resp} + T_{FR}\right)$$

wherein $S_{Buffer}$ refers to processor buffer size, $s_{calset(x)}$ refers to size of the processor calibration tables, m refers to a total number of calibration tables to be flash programmed for the processor, $P_{Bus}$ refers to bus baudrate, $Bits_{frame}$ refers to a number of bits per frame, $T_{IFWt}$ refers to inter-frame wait time, $T_{FW}$ refers to time to write calibration data in a RAM buffer of the processor to a flash memory device of the processor $T_{resp}$ refers to a time to transfer a response frame, and $T_{FR}$ refers to a time to a start of flow control frame transmission.

3. The system of claim 2, further comprising an interframe wait times determination module adapted to determine incremental interframe wait times according to:

$$T_{IFW}(j) = j * \frac{Bits_{frame}}{P_{bus}} \quad j = 1, 2, \ldots, N - 1.$$

4. The system of claim 1, wherein said input is receptive of a minimum flash programming time T(i, 0) and a maximum flash programming time T(i, N-1) of the processor obtained by experimentally programming the processor at a minimum interframe wait time $T_{IFW}(0)$ and a maximum interframe wait time $T_{IWF}(1)$ and recording the results.

5. The system of claim 4, wherein said incremental flash programming times determination module is adapted to determine incremental flash programming times T(i, j) of the processor according to:

$$T(i, j) = T(i, N - 1)\left(\frac{T(i, N - 1) - T(i, 0)}{T_{IFW}(1) - T_{IFW}(0)}\right) * [(N - 1) - j] * \frac{Bits_{frame}}{P_{bus}}$$

wherein $P_{Bus}$ refers to bus baudrate, and $Bits_{frame}$ refers to a number of bits per frame.

6. The system of claim 1, wherein said global flash programming time resolution module is adapted to perform multiple combinatorial assignments of processors to various numbers of tracks utilizing constraints specifying at least one processor per track, to determine multiple global programming times based on the multiple combinatorial assignments and the incremental flash programming times, and to select an assignment of processors to a number of tracks that minimizes the global flash programming time.

7. The system of claim 1, wherein said global flash programming time resolution module is adapted to select an interframe wait time based on the incremental flash programming times, and to select a number of parallel programming tracks corresponding to the interframe wait time.

8. The system of claim 7, wherein said global flash programming time resolution module adapted to determine multiple, average flash programming times of multiple interframe wait times based on the incremental flash programming times, to recursively compare an average flash programming time of an interframe wait time to a flash programming time of greatest magnitude of the interframe wait time and record the difference, and to select an interframe wait time at the difference is minimized.

9. The system of claim 7, wherein said global flash programming time resolution module is adapted to recursively designate an empty track as a current track, to designate a pool of unassigned flash programming times associated with the interframe wait time, to calculate a minimum global flash programming time respective of a current recursion as a total of flash programming times of the pool divided by a number of remaining tracks that includes the current track and all empty tracks, to assigning to the current track a flash programming time of greatest magnitude in the pool, thereby removing it from the pool with respect to a subsequent recursion, to calculate a best fit to the current track as a difference between a total of flash programming times assigned to the current track and the minimum global flash programming time, to select a best fitting flash programming time in the pool that most closely matches the best fit, to make a comparison between magnitude differences respective of minimum global flash programming times relating to current and subsequent recursions, wherein the comparison is dependent on whether the best fitting flash programming time is assigned to the current track, and to determine whether to assign the best fitting flash programming time to the current track based on the comparison, thereby minimizing differences between flash programming times of precedent and subsequent tracks.

10. The system of claim 1, further comprising a parallel flash programming module adapted to parallel flash program multiple processors in accordance with the assignment of the multiple processors to the number of parallel programming tracks, wherein the multiple processors are of the predetermined number, possess the processor flash programming characteristics, and are connected to a common system bus having the system bus attributes.

11. A parallel flash programming method for parallel flash programming multiple processors connected to a common bus, comprising:
receiving information relating to a predetermined number of processors connected to a system bus, processor flash programming attributes, and system bus attributes;
determining, based on the information, incremental flash programming times of a processor in relation to multiple interframe wait times respective of multiple parallel flash programming schema in accordance with the predetermined number of processors; and
determining, based on incremental flash programming times respective of multiple processors of the predetermined number, an assignment of the multiple processors to a number of parallel programming tracks yielding a global flash programming time in accordance with predetermined criteria.

12. The method of claim 11, further comprising mathematically determining incremental flash programming times T(i,j) of the processor according to:

$$T(i, j) = \sum_{x=1}^{m} \frac{S_{calset(x)}}{S_{Buffer}} * \left(\left(1 + \text{Roundup}\left(\frac{S_{Buffer} - 6}{7}\right)\right)\right) * \left(\frac{Bits_{frame}}{P_{Bus}} + T_{IFWt}\right) + T_{FW} + 2 * T_{resp} + T_{FR}\right)$$

wherein $S_{Buffer}$ refers to processor buffer size, $S_{calset(x)}$ refers to size of the processor calibration tables, m refers to a total number of calibration tables to be flash programmed for the processor, $P_{Bus}$ refers to bus baudrate, $Bits_{frame}$ refers to a number of bits per frame, $T_{IFWt}$ refers to inter-frame wait time, $T_{FW}$ refers to time to write calibration data in a RAM buffer of the processor to a flash memory device of the processor $T_{resp}$ refers to a time to transfer a response frame, and $T_{FR}$ refers to a time to a start of flow control frame transmission.

13. The method of claim 12, further comprising determining incremental interframe wait times according to, $$T_{IFW}(j) = j * \frac{Bits_{frame}}{P_{bus}} \quad j = 1, 2, \ldots, N-1.$$

14. The method of claim 11, further comprising experimentally determining a minimum flash programming time T(i, 0) and a maximum flash programming time T(i, N−1) of the processor by programming the processor at a minimum interframe wait time $T_{IFW}(0)$ and a maximum interframe wait time $T_{IFW}(1)$ and recording the results.

15. The method of claim 14, further comprising determining incremental flash programming times T(i,j) of the processor according to:

$$T(i, j) = T(i, N-1)\left(\frac{T(i, N-1) - T(i, 0)}{T_{IFW}(1) - T_{IFW}(0)}\right) * [(N-1) - j] * \frac{Bits_{frame}}{P_{bus}}$$

wherein $P_{Bus}$ baudrate, and $Bits_{frame}$ refers to a number of bits per frame.

16. The method of claim 11, further comprising:
performing multiple combinatorial assignments of processors to various numbers of tracks utilizing constraints specifying at least one processor per track;
determining multiple global programming times based on the multiple combinatorial assignments and the incremental flash programming times; and
selecting an assignment of processors to a number of tracks that minimizes the global flash programming time.

17. The method of claim 11, further comprising:
selecting an interframe wait time based on the incremental flash programming times;
selecting a number of parallel programming tracks corresponding to the interframe wait time.

18. The method of claim 17, further comprising:

determining multiple, average flash programming times of multiple interframe wait time based on the incremental flash programming times;

recursively comparing an average flash programming time of an interframe wait time to a flash programming time of greatest magnitude of the interframe wait time and recording the difference; and selecting an interframe wait time at which the difference is minimized.

19. The method of claim 17, further comprising:

recursively designating an empty track as a current track;

designating a pool of unassigned flash programming times associated with the interframe wait time;

calculating a minimum global flash programming time respective of a current recursion as a total of flash programming times of the pool divided by a number of remaining tracks that includes the current track and all empty tracks;

assigning to the current track a flash programming time of greatest magnitude in the pool, thereby removing it from the pool with respect to a subsequent recursion;

calculating a best fit to the current track as a difference between a total of flash programming times assigned to the current track and the minimum global flash programming time;

selecting a best fitting flash programming time in the pool that most closely matches the best fit;

making a comparison between magnitude differences respective of minimum global flash programming times relating to current and subsequent recursions, wherein the comparison is dependent on whether the best fitting flash programming time is assigned to the current track; and determining whether to assign the best fitting flash programming time to the current track based on the comparison, thereby minimizing differences between flash programming times of precedent and subsequent tracks.

20. The method of claim 11, further comprising parallel flash programming multiple processors in accordance with the assignment of the multiple processors to the number of parallel programming tracks,.wherein the multiple processors are of the predetermined number, possess the processor flash programming characteristics, and are connected to a common system bus having the system attributes.

* * * * *